United States Patent
Lim et al.

[11] Patent Number: 6,071,827
[45] Date of Patent: Jun. 6, 2000

[54] METHOD FOR MANUFACTURING SEMICONDUCTOR DEVICES

[75] Inventors: Kwang-shin Lim, Seoul; Eun-a Kim, Yongin; Sang-o Park, Osan, all of Rep. of Korea

[73] Assignee: Samsung Electronics, Co., Ltd., Suwon, Rep. of Korea

[21] Appl. No.: 09/136,139

[22] Filed: Aug. 18, 1998

[30] Foreign Application Priority Data

Aug. 19, 1997 [KR] Rep. of Korea ............... 97-39308

[51] Int. Cl.⁷ ......................................... H01L 21/00
[52] U.S. Cl. ................... 438/725; 134/2; 134/3; 252/79.3; 252/79.4; 438/745
[58] Field of Search ............... 252/79.2, 79.3, 252/79.4; 438/725, 745, 753; 216/67, 109; 134/1.3, 2, 3, 28, 39, 40

[56] References Cited

U.S. PATENT DOCUMENTS 5,164,018  11/1992  Barcelona .................... 252/79.3 X
5,783,495  7/1998  Li et al. ........................ 252/79.4 X

*Primary Examiner*—William Powell
*Attorney, Agent, or Firm*—Marger Johnson & McCollom, P.C.

[57] ABSTRACT

A method for manufacturing semiconductor devices including removing a photoresist and cleaning the substrate after removing the photoresist. The method for manufacturing semiconductor devices comprises removing the photoresist remaining on a semiconductor substrate using a dry etching process. The substrate is subsequently cleaned using a cleaning composition comprising a mixture of 25 to 35 weight percent of Isopropyl Alcohol (IPA), 2.0 to 4.0 weight percent of hydrogen peroxide ($H_2O_2$), 0.05 to 0.25 weight percent of hydrofluoric acid (HF), and the remaining weight percent of deionized water.

14 Claims, 2 Drawing Sheets

METHOD FOR MANUFACTURING SEMICONDUCTOR DEVICES

BACKGROUND OF THE INVENTION

1. Field of the Invention

The present invention relates to a method for manufacturing semiconductor devices and, more particularly, to a method for cleaning semiconductor devices using a cleaning composition comprising a mixture of Isopropyl Alcohol (IPA), hydrogen peroxide ($H_2O_2$), hydrofluoric acid (HF), and deionized water after removing a photoresist from the substrate using a dry etching process.

2. Description of the Related Art

Generally, the formation of well or contact holes in semiconductor devices involves a photo etching process using a photoresist. The photo etching process involves selectively opening a certain region in the substrate for the formation of the well or contact holes.

After the well or contact holes are formed by the photo etching process, the photoresist is removed and the surface of the semiconductor substrate is cleaned. The photoresist is removed in two steps. First, the hardened surface of the photoresist is removed by carrying out a dry etching process at predetermined temperature ranges. The dry etching process involves applying an etching gas to the semiconductor memory device. Second, the remaining photoresist is completely removed by using a chemical composition including $H_2SO_4$ or a combination of $NH_4OH_2$, $H_2O_2$, and $H_2O$ commonly referred to as SC-1. Thus, the conventional photoresist removing process involves a dry etching process using a gas and a wet etching process using a chemical composition such as SC-1.

After the photoresist is removed, the substrate is cleaned to remove contamination on the surface of the semiconductor substrate and a native oxide film grown on the surface of the semiconductor substrate. The cleaning process involves using a cleaning composition comprising $H_2SO_4$ heated to 120° C. or a cleaning composition such as SC-1, hydrofluoric acid (HF), or the like which varies according to the types of lower films exposed by removing the photoresist. Thus, the complicated processing steps involved in removing the photoresist and cleaning the substrate increase manufacturing time resulting in a productivity reduction.

SUMMARY OF THE INVENTION

The present invention provides an improved method for manufacturing semiconductor devices by reducing the fabrication time and increasing the cleaning efficiency resulting in increased productivity and reliability.

To achieve this and other advantages and in accordance with the purpose of the present invention as embodied and broadly described, the method for manufacturing semiconductor devices comprises removing a predetermined region of the photoresist remaining on a semiconductor substrate using a dry etching process. The dry etching process applies a mixture of nitrogen and oxygen gases. Preferably, the dry etching process is carried out between 50 to 3,600 seconds.

After the well is formed and the photoresist is removed from the substrate, the substrate is cleaned using a cleaning composition. The cleaning composition comprises 25 to 35 weight percent isopropyl alcohol (IPA), 2.0 to 4.0 weight percent hydrogen peroxide ($H_2O_2$), 0.05 to 0.25 weight percent hydrofluoric acid (HF), and a remaining weight percent deionized water. Preferably, the cleaning composition includes deionized water, 100 percent of IPA, 30 percent of $H_2O_2$, and 50 percent of HF mixed in order. Additionally, the cleaning composition is preferably applied at a temperature between 20 to 30° C.

According to another embodiment of the present invention, a for manufacturing semiconductor devices comprises depositing photoresist on a semiconductor substrate, removing a predetermined region of photoresist from the substrate using a photo etching process, and forming a well on the substrate by injecting impurities into a region of the substrate exposed by the removal of the photoresist. The method further comprises removing the photoresist remaining on said semiconductor substrate using a dry etching process and cleaning the substrate after removing the remaining photoresist using a cleaning composition comprising the mixture of 25 to 35 weight percent isopropyl alcohol (IPA), 2.0 to 4.0 weight percent hydrogen peroxide ($H_2O_2$), 0.05 to 0.25 weight percent hydrofluoric acid (HF), and a remaining weight percent deionized water.

Preferably, the dry etching process is carried out between 50 to 3,600 seconds using a mixture of nitrogen and oxygen gases. Also preferably, the substrate is cleaned using a cleaning composition comprising the mixture of 30 weight percent of Isopropyl Alcohol (IPA), 3 weight percent of $H_2O_2$, 0.2 weight percent of HF, and a remaining percent of deionized water. The cleaning composition is applied between 60 to 600 seconds at a temperature of 20 to 30° C.

According to yet another embodiment of the present invention, the method for manufacturing semiconductor devices comprises forming an insulating film on a semiconductor substrate, depositing photoresist over the insulating film, and removing a predetermined region of the photoresist using a photo etching process. The method further comprises forming contact holes by etching a region of the insulating film exposed by the removal of the photoresist, removing the photoresist remaining on the insulating film using a dry etching process, and cleaning the substrate using a cleaning composition comprising a mixture of 25 to 35 weight percent isopropyl alcohol (IPA), 2.0 to 4.0 weight percent hydrogen peroxide ($H_2O_2$), 0.05 to 0.25 weight percent hydrofluoric acid (HF), and a remaining weight percent deionized water.

Preferably, the dry etching process applies a mixture of nitrogen and oxygen gases for 50 to 3,600 seconds. Also preferably, the cleaning composition comprises a mixture of 30 weight percent of Isopropyl Alcohol (IPA), 3 weight percent of $H_2O_2$, 0.2 weight percent of HF, and remaining percent of deionized water. The cleaning composition is applied to the substrate for 60 to 600 seconds at temperature of 20 to 30° C.

The foregoing and other objects, features, and advantages of the invention will become more readily apparent from the following detailed description of a preferred embodiment that proceeds with reference to the drawings.

DETAILED DESCRIPTION OF THE PREFERRED EMBODIMENTS

According to the present invention, a first embodiment of the present invention involves removing the photoresist used as ion-injection mask during the well-formation process on a certain region of a semiconductor substrate and the subsequent cleaning process. A second embodiment of the present invention involves removing the photoresist used as an etching mask during the contact-hole formation process and the subsequent cleaning process.

1. First Embodiment

Figure 1:
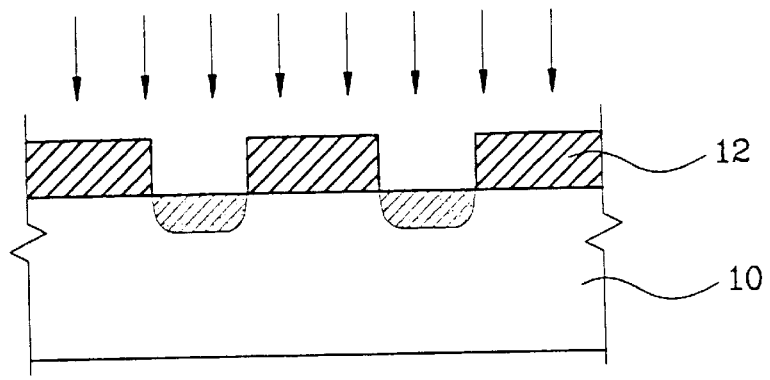
FIGS. 1–3 are cross-sectional views of a first embodiment of the method for manufacturing semiconductor devices according to the present invention.
Figure 2:
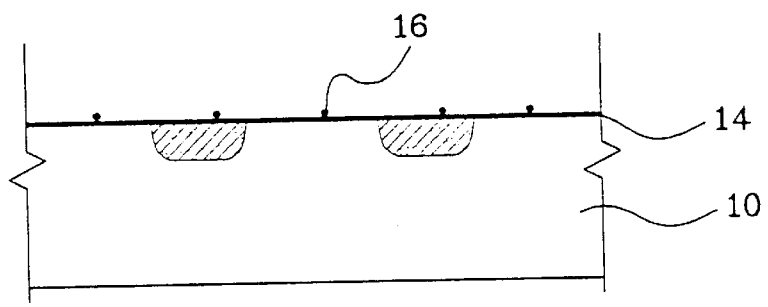
Figure 3:
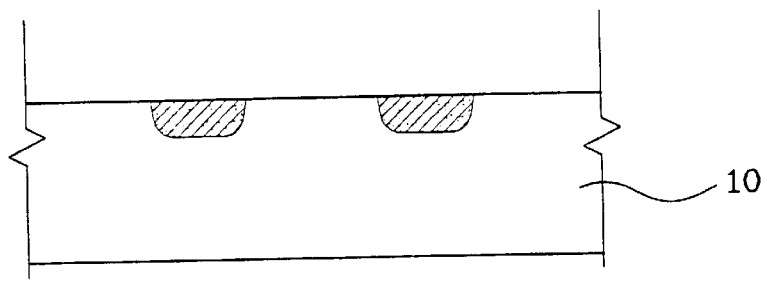

FIGS. 1 through 3 are cross-sectional views of a first embodiment of the present invention. Referring to FIG. 1, a predetermined region of the photoresist 12 deposited on the semiconductor substrate 10 is removed using a photo etching process. The well 11 is formed after the photo etching process is completed. To form the well, impurities are injected into the semiconductor substrate 10 using an ion-injection process in the first embodiment of the present invention.

FIG. 2 is a cross-sectional view of the device after the well 11 is formed. After forming the well 11 on the semiconductor substrate 10, the photoresist 12, used as an ion-injection mask in FIG. 1, is removed. During the process of removing the photoresist 12, a native film 14 and a contamination source 16 grow and remain on the substrate 10.

The photoresist 12 is removed using a dry etching process in which a gas mixture of nitrogen and oxygen is used. The dry etching process for removing the photoresist 12 can be performed in various ways in accordance with the available etching facilities. The dry etching process of the present invention is carried out between 50 to 3,600 seconds. Preferably, the dry etching process is carried out between 55 to 3,000 seconds.

The surface of the semiconductor substrate 10 is cleaned using a cleaning process. During the cleaning process, the native oxide film 14 and the contamination source 16 grown in the semiconductor substrate 10 are removed (FIG. 3).

The cleaning process of the present invention applies a cleaning composition comprising a mixture of 20 to 40 weight percent of IPA, 1.0 to 5.0 weight percent of $H_2O_2$, 0.05 to 0.25 weight percent of HF, and the remaining percent of deionized water. The above-listed components are mixed in order. The preferred cleaning composition of the first embodiment comprises the mixture of 30 weight percent of Isopropyl Alcohol (IPA), 3 weight percent of $H_2O_2$, 0.2 weight percent of HF, and the remaining percent of deionized water. In addition, the cleaning composition of the present invention comprises deionized water, 100 weight percent of IPA, 30 weight percent of $H_2O_2$, and 50 weight percent of HF. The above-listed components are mixed in order.

The cleaning process of the present invention lasts between 60 and 600 and at cleaning temperatures between 15 to 25° C. Preferably, the cleaning process lasts for 300 sec. at a 20° C. temperature.

In the first embodiment of the present invention, the photoresist 12 is removed by the dry etching process and then the surface of the semiconductor substrate 10 is cleaned using the specified cleaning composition. By doing so, the processing steps are simplified, shortening the manufacturing time.

Further, the cleaning process using the specified cleaning composition of the present invention improves the cleaning efficiency. After completing the cleaning process, the metallic elements and other like contaminates analyzed using Atomic Absorption Spectroscopy (AAS) and the ion elements analyzed using High Performance Ion Chromatography (HPIC) are considerably reduced.

The method of the present invention is as follows. First, the photoresist 12 is deposited on a semiconductor substrate 10. A predetermined region of the photoresist 12 is then removed using the photo etching process. After removing the photoresist 12, impurities are injected into the region of the substrate where the photoresist 12 is removed. The impurities are injected into the substrate using an ion-injection process resulting in the formation of the well 11.

After the formation of the well 11, a dry etching process is carried out to remove the photoresist 12 used as the ion-injection mask. The dry etching process lasts between 55 sec. and 3000 seconds and applies a nitrogen and oxygen gas mixture. The optimum duration of the dry etching process is adjusted according to the etching facilities.

After removing the photoresist 12 using the dry etching process, the surface of the semiconductor substrate 10 is cleaned using a cleaning process. The cleaning process preferably lasts 300 seconds. The cleaning process involves the application of the above-described cleaning composition preferably at a temperature of 20° C. The cleaning composition preferably comprises a mixture of 30 weight percent of Isopropyl Alcohol (IPA), 3.0 weight percent of $H_2O_2$, 0.2 weight percent of HF, and the remaining weight percent of deionized water.

By cleaning the surface of the semiconductor substrate 10 exposed by removing the photoresist 12 using the cleaning process and composition of the present invention, contamination sources such as the native oxide film 14 or metallic or ionic elements grown on the semiconductor substrate 10 are removed.

The cleaning process of the present invention allows the formation of a uniform film on the semiconductor substrate 10. After the cleaning process, the substrate is analyzed to determine the results of the cleaning process. The analysis involves using AAS and HPIC to determined the number of metallic and ionic elements, respectively, remaining on the substrate after the substrate is cleaned. Table 1 shows an analysis of the cleaning efficiency for a conventional cleaning process and the cleaning process of the present invention using the specified cleaning composition. As shown in Table 1, the metallic and ionic elements are greatly reduced after cleaning the substrate using the cleaning process and the cleaning composition of the present invention. Thus, the cleaning efficiency is greatly improved.

TABLE 1

|  | NA (PPB) | K (PPB) | CL (PPB) | FE (PPB) | CA (PPB) | ZN (PPB) | TOC (PPM) |
| --- | --- | --- | --- | --- | --- | --- | --- |
| prior art | 54.8 | 74.7 | 113 | 49.9 | 3.85 | 43.9 | 9.05 |
| present invention | 37.4 | 7.3 | 97 | 25.4 | 0.57 | 24.9 | 3.51 |

As illustrated in Table 1, the cleaning process using the cleaning composition of the present invention reduces the total organic carbon (TOC) on the substrate from 9.05 ppm to 3.51 ppm.

Therefore, in the first embodiment of the present invention, the removal of the photoresist 12 used as ion-injection mask during the formation of well 11 and the subsequent cleaning process are carried out using a dry etching process and the specified cleaning composition reducing the processing steps while improving the cleaning efficiency.

2. Second Embodiment

Figure 4:
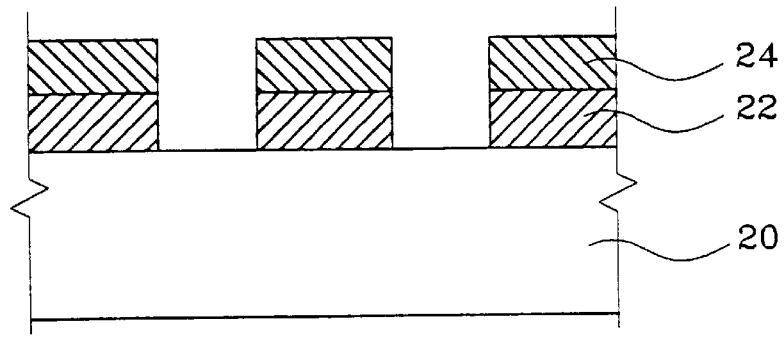
FIGS. 4–6 are cross-sectional views of a second embodiment of the method for manufacturing semiconductor devices according to the present invention.
Figure 5:
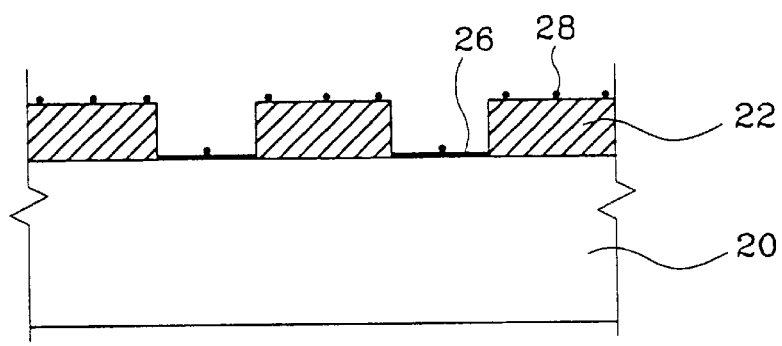
Figure 6:
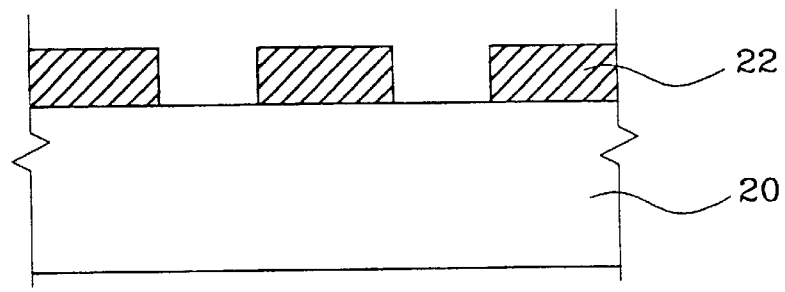

FIGS. 4 through 6 are cross-sectional views of a second embodiment for the method for manufacturing semiconductor devices according to the present invention. First, as shown in FIG. 4, a predetermined region of the insulating film 22 on the semiconductor substrate 20 and the photoresist 24 deposited thereon are removed and contact holes are formed.

FIG. 5 shows that the photoresist 24 is removed after the contact holes are formed. A native oxide film 26 and a contamination source 28 remain on the semiconductor substrate 20 having the insulating film 22 after the removal of the photoresist 24. At this stage, the removal of the photoresist 24 in the second embodiment is carried out using a dry etching process. The conditions for the dry etch process are the same as those described for the first embodiment.

Next, the native oxide film 26 and the contamination source 28 grown on the semiconductor substrate 20 including the insulating film 22 are removed using a cleaning process (FIG. 6). The conditions for the cleaning process and the cleaning composition thereof in the second embodiment of the present invention are the same as those described for the first embodiment.

According to the second embodiment of the present invention, the removal of the photoresist 24 used as etching mask during the formation of the well, and the cleaning process applied to the surface of the semiconductor substrate 20 and the insulating film 22 are performed at the same time. The cleaning process of the present invention reduces the TOC from 12.08 ppm to 7.59 PPM. Accordingly, the processing steps are simplified and the cleaning efficiency is greatly improved in the second embodiment of the present invention.

In addition, by controlling the concentration of the HF in the above-described cleaning composition, the cleaning composition is efficiently used in the cleaning process for the cases varying lower films therein. Therefore, according to the present invention, the processing steps are simplified reducing manufacturing time and improving productivity, cleaning efficiency, and the reliability of the devices.

Having illustrated and described the principles of my invention in preferred embodiments thereof, it should be readily apparent to those skilled in the art that the invention can be modified in arrangement and detail without departing from such principles. We claim all modifications coming within the spirit and scope of the accompanying claims.

What is claimed is:

1. A method for manufacturing semiconductor devices, comprising:
   removing a region of photoresist from a semiconductor substrate; and
   cleaning the semiconductor substrate after removing the region of photoresist using a cleaning composition comprising 25 to 35 weight percent isopropyl alcohol (IPA), 2.0 to 4.0 weight percent hydrogen peroxide ($H_2O_2$), 0.05 to 0.25 weight percent hydrofluoric acid (HF), and a remaining weight percent deionized water.

2. The method for manufacturing semiconductor devices of claim 1 wherein removing a region of photoresist includes applying a dry etching process utilizing a mixture of nitrogen and oxygen gases.

3. The method for manufacturing semiconductor devices of claim 2 wherein the dry etching process is applied to the semiconductor device for 50 to 3,600 seconds.

4. The method for manufacturing semiconductor devices of claim 1 wherein cleaning the semiconductor substrate includes using a cleaning composition in which deionized water, 100 percent EPA, 30 percent $H_2O_2$, and 50 percent HF are mixed in order.

5. The method for manufacturing semiconductor devices of claim 1 wherein cleaning the semiconductor substrate includes applying the cleaning composition at a temperature between 20 and 30° C.

6. The method for manufacturing semiconductor devices of claim 1 wherein cleaning the semiconductor substrate includes applying the cleaning composition to the substrate for 60 to 600 seconds.

7. A method for manufacturing semiconductor devices, comprising:
   depositing photoresist on a semiconductor substrate;
   removing a region of photoresist from the substrate using a photo etching process;
   forming a well on the substrate by injecting impurities into a region of the substrate exposed by the removal of the photoresist;
   removing the photoresist remaining on said semiconductor substrate using a dry etching process; and
   cleaning the substrate after removing the remaining photoresist using a cleaning composition comprising the mixture of 25 to 35 weight percent isopropyl alcohol (IPA), 2.0 to 4.0 weight percent hydrogen peroxide ($H_2O_2$), 0.05 to 0.25 weight percent hydrofluoric acid (HF), and a remaining weight percent deionized water.

8. The method for manufacturing semiconductor devices of claim 7 wherein the dry etching process is applied to the substrate for 50 to 3,600 seconds using a mixture of nitrogen and oxygen gases.

9. The method for manufacturing semiconductor devices of claim 7 wherein cleaning the substrate includes applying a cleaning composition comprising a mixture of 30 weight percent IPA, 3 weight percent $H_2O_2$, 0.2 weight percent HF, and a remaining weight percent deionized water.

10. The method for manufacturing semiconductor devices of claim 7 wherein cleaning the substrate includes applying the cleaning composition for 60 to 600 seconds at a temperature of 20 to 30° C.

11. A method for manufacturing semiconductor devices, comprising:
   forming an insulating film on a semiconductor substrate;
   depositing photoresist over the insulating film;
   removing a region of the photoresist using a photo etching process;
   forming contact holes by etching a region of the insulating film exposed by the removal of the photoresist;
   removing the photoresist remaining on the insulating film using a dry etching process; and
   cleaning the substrate using a cleaning composition comprising a mixture of 25 to 35 weight percent isopropyl alcohol (IPA), 2.0 to 4.0 weight percent hydrogen peroxide ($H_2O_2$), 0.05 to 0.25 weight percent hydrofluoric acid (HF), and a remaining weight percent deionized water.

12. The method for manufacturing semiconductor devices of claim 11 wherein the dry etching process includes applying a mixture of nitrogen and oxygen gases for 50 to 3,600 seconds.

13. The method for manufacturing semiconductor devices of claim 11 wherein cleaning the substrate includes applying a cleaning composition comprising 30 weight percent isopropyl alcohol (IPA), 3 weight percent hydrogen peroxide ($H_2O_2$), 0.2 weight percent hydrofluoric acid (HF), and a remaining weight percent deionized water.

14. The method for manufacturing semiconductor devices of claim 11 wherein cleaning the substrate includes applying the cleaning composition for 60 to 600 seconds at a temperature between 20 to 30° C.

* * * * *

UNITED STATES PATENT AND TRADEMARK OFFICE
CERTIFICATE OF CORRECTION

PATENT NO.   : 6,071,827
DATED        : June 6, 2000
INVENTOR(S)  : Kwang-shin Lim et al.

Page 1 of 1

It is certified that error appears in the above-identified patent and that said Letters Patent is hereby corrected as shown below:

<u>Column 6,</u>
Line 9, "EPA" should read -- IPA --.

Signed and Sealed this

Eleventh Day of February, 2003

JAMES E. ROGAN
*Director of the United States Patent and Trademark Office*